(12) United States Patent
Root et al.

(10) Patent No.: US 7,626,404 B2
(45) Date of Patent: Dec. 1, 2009

(54) REPLACEABLE PROBE APPARATUS FOR PROBING SEMICONDUCTOR WAFER

(75) Inventors: Bryan J. Root, Apple Valley, MN (US); William A. Funk, Eagan, MN (US)

(73) Assignee: Celadon Systems, Inc., Apple Valley, MN (US)

(*) Notice: Subject to any disclaimer, the term of this patent is extended or adjusted under 35 U.S.C. 154(b) by 0 days.

(21) Appl. No.: 11/216,757

(22) Filed: Aug. 31, 2005

(65) Prior Publication Data

US 2006/0049841 A1   Mar. 9, 2006

Related U.S. Application Data

(60) Provisional application No. 60/606,994, filed on Sep. 3, 2004, provisional application No. 60/607,013, filed on Sep. 3, 2004, provisional application No. 60/607,062, filed on Sep. 3, 2004.

(51) Int. Cl.
*G01R 31/02* (2006.01)

(52) U.S. Cl. ........................ 324/754; 324/758

(58) Field of Classification Search ............... 324/754, 324/761, 755, 72.5
See application file for complete search history.

(56) References Cited

U.S. PATENT DOCUMENTS

| | | | | |
|---|---|---|---|---|
| 3,560,907 A | * | 2/1971 | Heller | 439/626 |
| 4,768,973 A | * | 9/1988 | Bakermans | 439/331 |
| 4,849,689 A | * | 7/1989 | Gleason et al. | 324/754 |
| 5,148,103 A | * | 9/1992 | Pasiecznik, Jr. | 324/758 |
| 5,345,170 A | * | 9/1994 | Schwindt et al. | 324/754 |
| 5,517,126 A | | 5/1996 | Yamaguchi | |
| 5,804,983 A | * | 9/1998 | Nakajima et al. | 324/758 |
| 5,821,764 A | * | 10/1998 | Slocum et al. | 324/758 |
| 6,037,785 A | | 3/2000 | Higgins | |
| 6,201,402 B1 | | 3/2001 | Root | |
| 6,377,062 B1 | | 4/2002 | Ramos et al. | |
| 6,420,888 B1 | * | 7/2002 | Griffin et al. | 324/754 |
| 6,429,673 B1 | | 8/2002 | Obata et al. | |
| 6,441,629 B1 | * | 8/2002 | Khoury et al. | 324/757 |
| 6,586,954 B2 | * | 7/2003 | Root | 324/754 |
| 6,608,496 B1 | * | 8/2003 | Strid et al. | 324/754 |
| 6,696,849 B2 | * | 2/2004 | Ban et al. | 324/760 |
| 6,710,608 B2 | * | 3/2004 | Yoshida et al. | 324/754 |
| 6,744,267 B2 | * | 6/2004 | Sauk et al. | 324/754 |
| 6,798,227 B1 | * | 9/2004 | Hwang | 324/754 |
| 6,882,168 B2 | | 4/2005 | Root | |
| 6,963,207 B2 | * | 11/2005 | Root et al. | 324/754 |
| 6,975,128 B1 | | 12/2005 | Root et al. | |
| 2004/0000920 A1 | | 1/2004 | Root et al. | |

* cited by examiner

*Primary Examiner*—Ha Tran T Nguyen
*Assistant Examiner*—Arleen M Vazquez
(74) *Attorney, Agent, or Firm*—Hamre, Schumann, Mueller & Larson, P.C.

(57) ABSTRACT

A probe apparatus for probing a device on a semiconductor wafer to be tested by a testing equipment is provided. The probe apparatus includes a replaceable probe tile removably mounted in a probing location on a base plate. The probe tile is configured into a self-contained assembly which includes a chassis body containing a plurality of probes for probing devices on a wafer, a dielectric block for supporting the probes, and a wireguide for guiding a plurality of cables from the testing equipment into the chassis body. A wafer station having replaceable base plates and replaceable probe tiles are also provided.

3 Claims, 15 Drawing Sheets

REPLACEABLE PROBE APPARATUS FOR PROBING SEMICONDUCTOR WAFER

CROSS-REFERENCE TO RELATED APPLICATION(S)

The present patent application claims priority from U.S. Provisional Patent Application, Ser. No. 60/606,994, filed Sep. 3, 2004; from U.S. Provisional Patent Application Ser. No. 60/607,013, filed Sep. 3, 2004; from U.S. Provisional Patent Application Ser. No. 60/607,062, filed Sep. 3, 2004; and is related to U.S. Utility patent application Ser. No. 09/730,130, filed on Dec. 4, 2000, now issued U.S. Pat. No. 6,586,954; to U.S. Utility patent application Ser. No. 10/601,764, filed on Jun. 23, 2003; to U.S. Utility patent application Ser. No. 09/021,631, filed on Feb. 10, 1998, now issued U.S. Pat. No. 6,201,402; to U.S. Utility patent application Ser. No. 10/607,768, filed on Jun. 27, 2003; to U.S. patent application Ser. No. 10/383,079, filed on Mar. 6, 2003; to U.S. Utility patent application Ser. No. 10/809,051, filed on Mar. 25, 2004; subject matter of which are incorporated herewith by references.

FIELD OF THE INVENTION

The present invention relates generally to semiconductor testing equipment, and more particularly, to a probe apparatus used in semiconductor testing equipment for electrically probing devices on a semiconductor wafer.

BACKGROUND OF THE INVENTION

The semiconductor industry has a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA. In addition, the currents and device characteristics are often required to be evaluated over a wide temperature range to understand how temperature affects a device.

Also, the electronic devices are often placed on wafers in different locations due to different die sizes. Additionally, due to the wide variety of die pitches (referring to the spacing between adjacent devices on a die/wafer or the corresponding spacing between adjacent probe tiles on a probe tile plate (or sometimes referred to as "base plate"), users need the flexibility of reusing the probe tiles in various base plates. The size of a die pitch may vary, for example, from 10 mm$^2$ to 30 mm$^2$, etc. Further, the shape of a die pitch may vary as well, for example, a rectangular shape, a square shape, etc. At present, semiconductor testing equipment is designed such that a user has to use different probe tiles if the size or shape of die pitches on a die/wafer is different.

Accordingly, to effectively measure these devices, there is a need for a compact, probe apparatus having a plurality of probe tiles for probing devices whereby the probe tiles can be mounted in a new location and provides new versatility and capability. Further, there is a need for improved semiconductor testing equipment for electrically probing semiconductor devices at low currents, over a wide temperature range.

SUMMARY OF THE INVENTION

To solve the above and the other problems, the present invention provides a probe apparatus for testing semiconductor devices on a wafer comprising replaceable probe tiles.

In one embodiment, a replaceable probe tile is configured into a self-contained assembly. The assembly includes a chassis body that contains a plurality of probes for probing devices on a wafer, a ceramic dielectric block for supporting the probes, at least one wireguide for guiding a plurality of cables from an external testing equipment into the chassis body, and a plurality of electrical connections for connecting the probes to the cables received in the chassis body. The probe tile is removably mounted in a precise location on a base plate by using a guide mechanism. A user can remove the probe tile and place it into a different location or slot on the base plate to accommodate different die pitches.

Still in one embodiment, the assembly further includes a top cover, a spacer disposed between the wireguide and the chassis body, and a bottom cover. The wireguide includes a plurality of access slots on its side walls for receiving the cables and having a bore for directing the cables from the external testing equipment to the devices on the wafer.

Further in one embodiment, the guide mechanism includes a modular adapter which can be used to receive a variety of base plates and adapt to a variety of probe stations for testing devices on a semiconductor wafer. The guide mechanism includes a plurality of knobs and/or other means of adjusting planetary and/or tilting angles of the base plate so that the base plate aligns with a wafer on the wafer station for precise probing and testing. The guide mechanism may also include an interface member configured and arranged to fit the base plate in the modular adapter for different probe stations.

Additionally in one embodiment, the base plate includes at least one probe tile slot for receiving the probe tile, and a locating mechanism for providing a precise location for the probe tile to test the device on the wafer.

Yet in one embodiment of the present invention, a replaceable probe tile is mounted on a distal end of a manipulator of a probing apparatus for electrically testing semiconductor devices on a wafer. Each probe tile is a self-contained unit and removable from the respective manipulator for re-use. Accordingly, multiple devices on the wafer can be tested simultaneously, and different sets of devices on the wafer can be tested after replacing at least some of the probe tiles.

In another embodiment of the present invention, replaceable probe tiles are mounted on a probe tile plate or base plate for testing semiconductor devices on a wafer. The base plate can be replaced for adapting to a wafer with different die pitches. The probe tiles are removable from the base plate for re-use.

In yet another embodiment of the present invention, the replaceable probe tiles are mounted on a stand-alone wafer station. The wafer station includes an enclosure for housing a replaceable base plate and a plurality of probe tiles removably mounted on the base plate.

These and other advantages of the present invention will become apparent to those skilled in the art from the following detailed description, wherein it is shown and described illustrative embodiments of the invention, including best modes contemplated for carrying out the invention. As it will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION OF THE PREFERRED EMBODIMENTS

Figure 1:
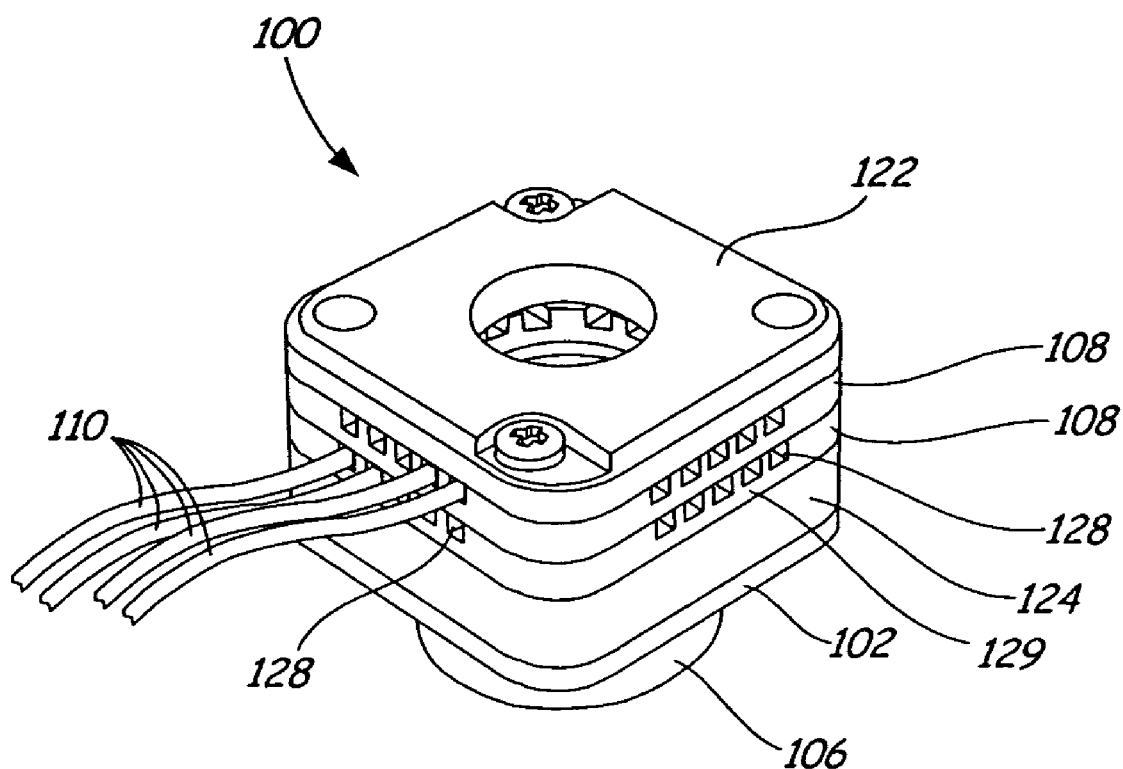
FIG. 1 illustrates a perspective view of one embodiment of a replaceable probe tile of a probing apparatus in accordance with the principles of the present invention.
Figure 2:
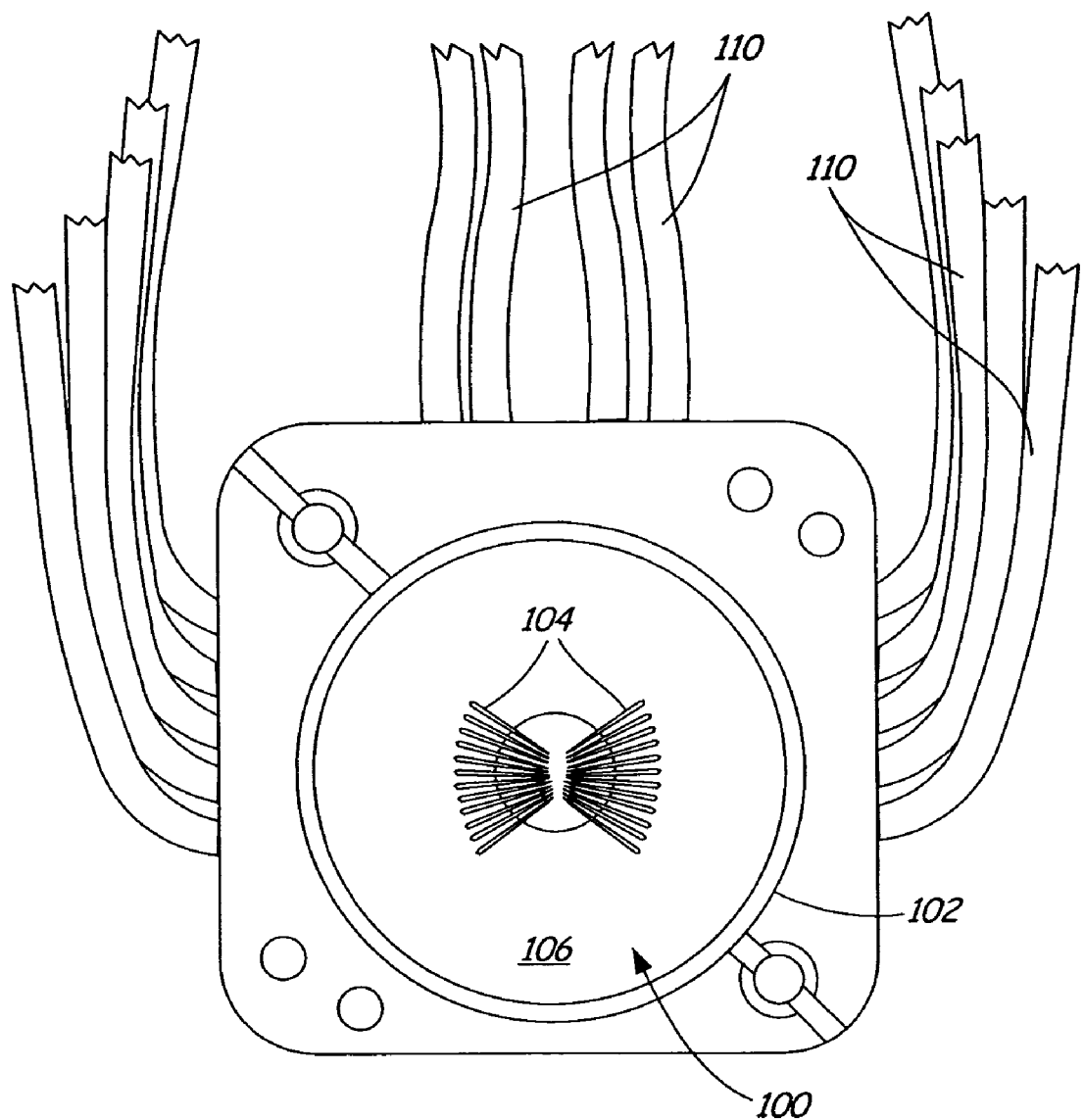
FIG. 2 illustrates a bottom view of one embodiment of a replaceable probe tile of a probing apparatus in accordance with the principles of the present invention.

The present invention provides a probe apparatus having a replaceable probe tile, for testing a device on a semiconductor wafer. FIG. 1 illustrates one embodiment of a replaceable probe tile 100. The probe tile 100 is configured into a self-contained assembly. As shown in FIGS. 1-7, the assembly includes a chassis body 102 that contains a plurality of probes 104 for probing devices on a semiconductor wafer (not shown), a ceramic dielectric block 106 for supporting the probes 104, at least one wireguide 108 for guiding a plurality of cables 110 from an external testing equipment into the chassis body 102, and a plurality of electrical connections (not shown) for connecting the probes 104 to the cables 110 received in the chassis body 102.

Figure 8:
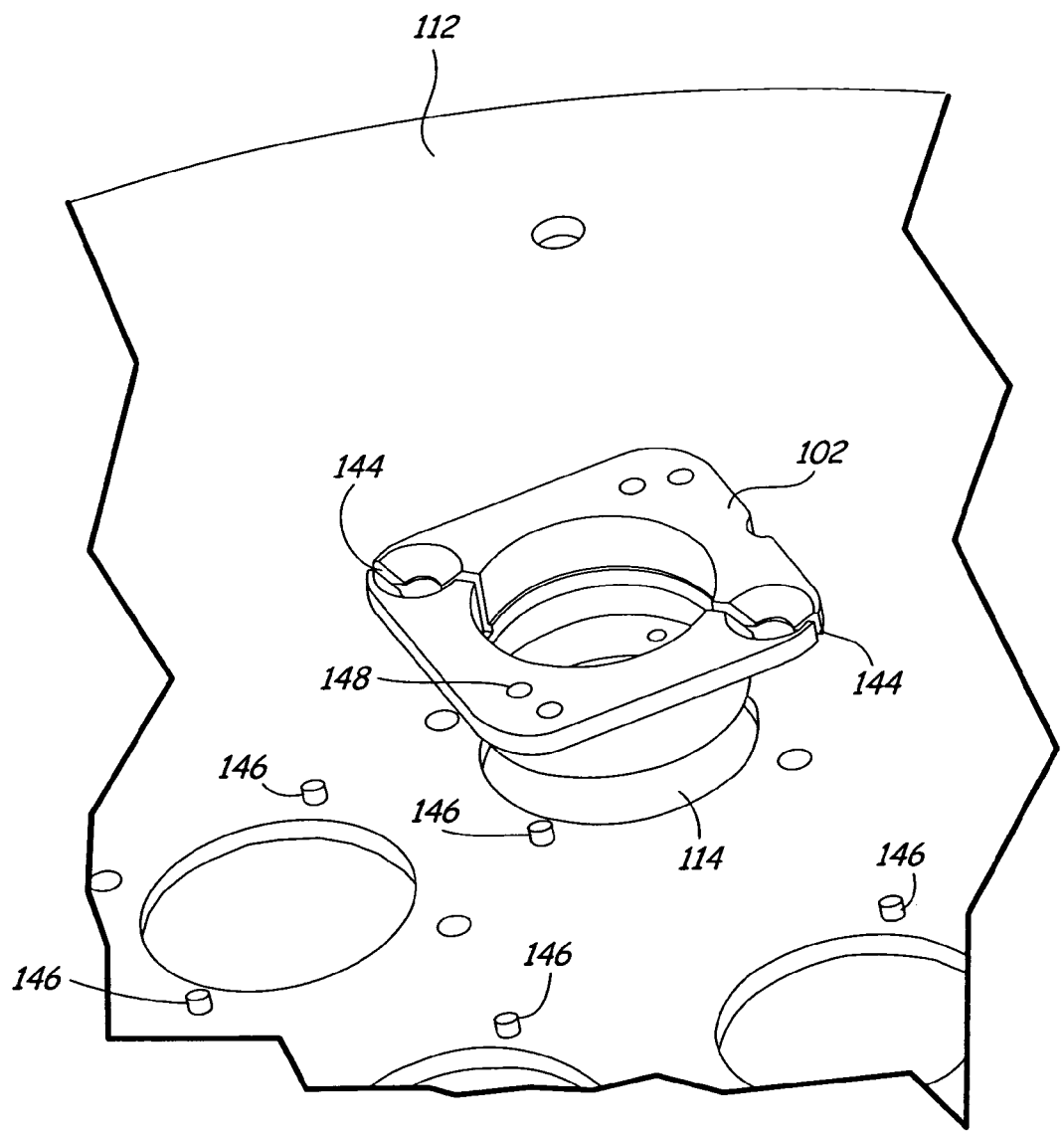
FIG. 8 illustrates a perspective, partial view of a base plate having a plurality of probing locations or slots, and a chassis body as shown in FIG. 7 that is removable from one of the probing locations in accordance with the principles of the present invention.
Figure 9:
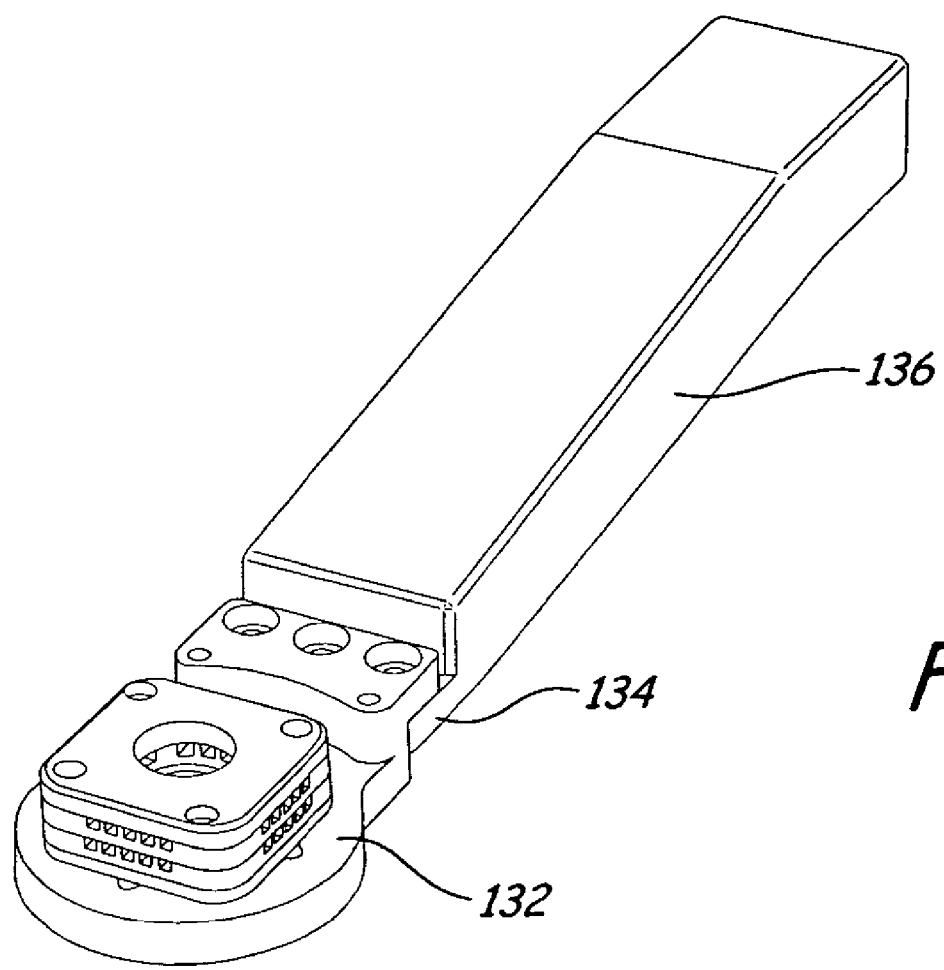
FIG. 9 illustrates a perspective view of one embodiment of a probe tile mounted on a manipulator of a probing apparatus as shown in FIG. 4.
Figure 11A:
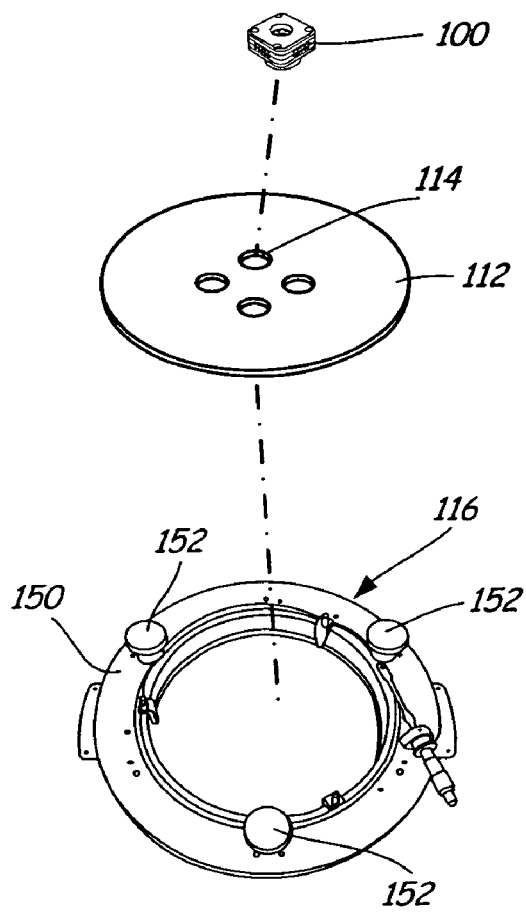
FIG. 11a illustrates a perspective, partially exploded view of a probing apparatus showing a probe tile to be mounted on a base plate to be housed in and adjusted by a modular adapter in accordance with the principles of the present invention.
Figure 11B:
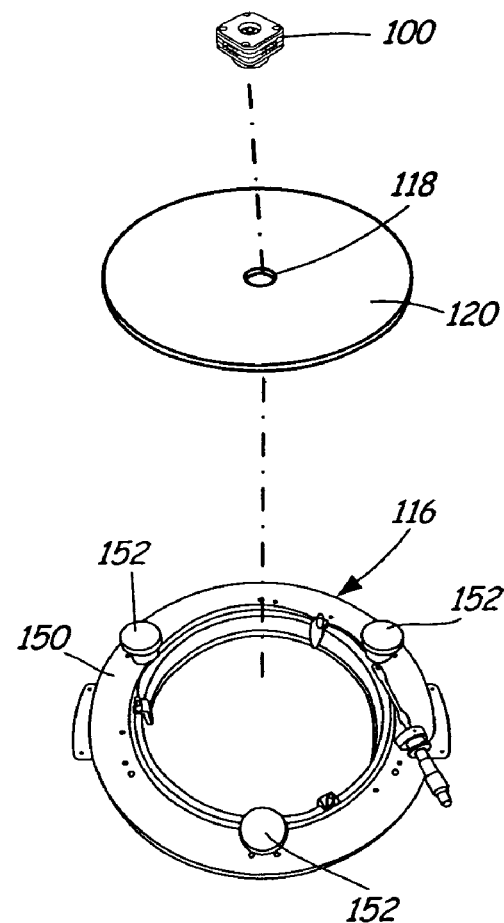
FIG. 11b illustrates a perspective, partially exploded view of a probing apparatus showing the probe tile of FIG. 11a to be mounted on a different base plate in accordance with the principles of the present invention.
Figure 11C:
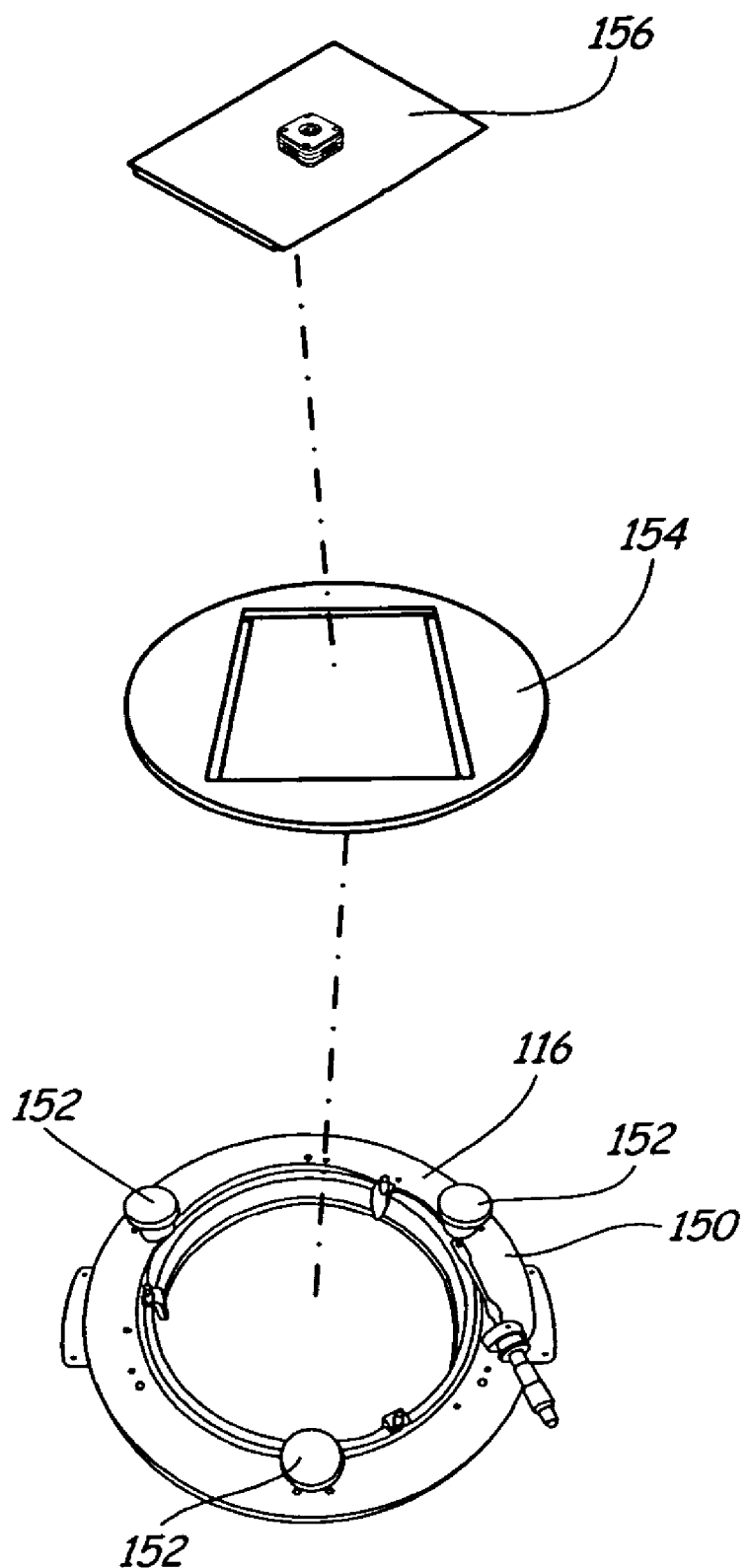
FIG. 11c illustrates a perspective, partially exploded view of a probing apparatus showing the probe tile of FIG. 11a to be mounted on yet another base plate or probe card and then on an interface member to be housed in and adjusted by a modular adapter in accordance with the principles of the present invention.

As shown in FIG. 8, the probe tile 100 is removably mounted on a base plate 112. For the purpose of illustration, only the chassis body 102 is shown to be disposed on top of one of locations or slots 114 in the base plate 112. Further, the chassis body 102 can be mounted at a precise location on the base plate 112 by using a guide mechanism 116, and an example of which is shown in FIGS. 11a-11c (see detailed below). A user can remove the probe tile 100 and place it into a different location 118 of a different base plate 120 to accommodate different die pitches. It will be appreciated that a replaceable probe tile 100 can also be placed in a different location of the same base plate 110.

Figure 6:
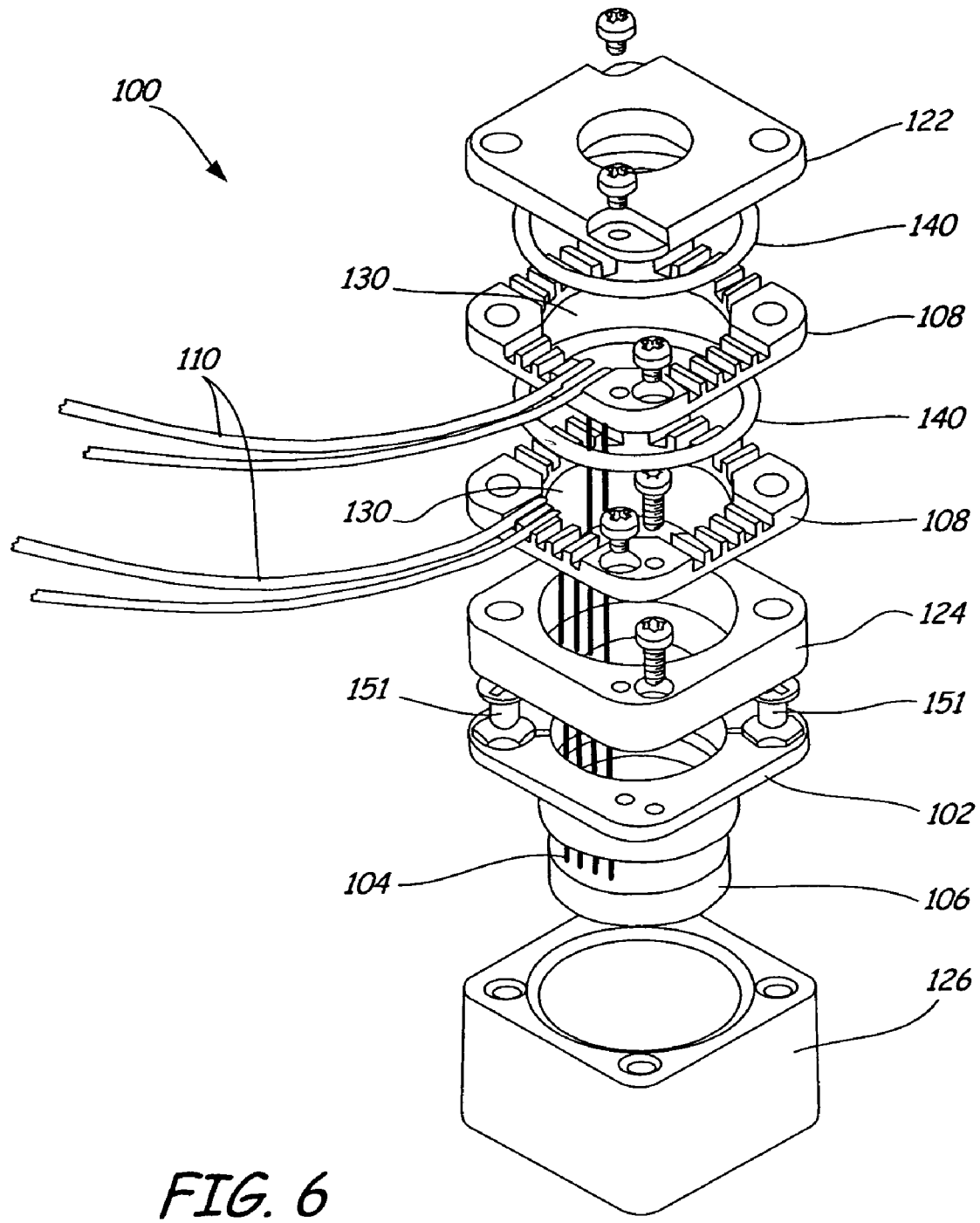
FIG. 6 illustrates an exploded view of the probe tile as shown in FIG. 1 except with a bottom cover thereon.

In FIGS. 1-8, the assembly of the probe tile 100 further includes a top cover 122, a spacer 124 disposed between the wireguide 108 and the chassis body 102, and a bottom cover 126 (see FIG. 6). The wireguide 108 includes a plurality of access slots 128 on its side walls 129 for receiving the cables 110 and having a bore 130 for directing the cables 110 from the external testing equipment to the devices on the wafer.

Figure 3:
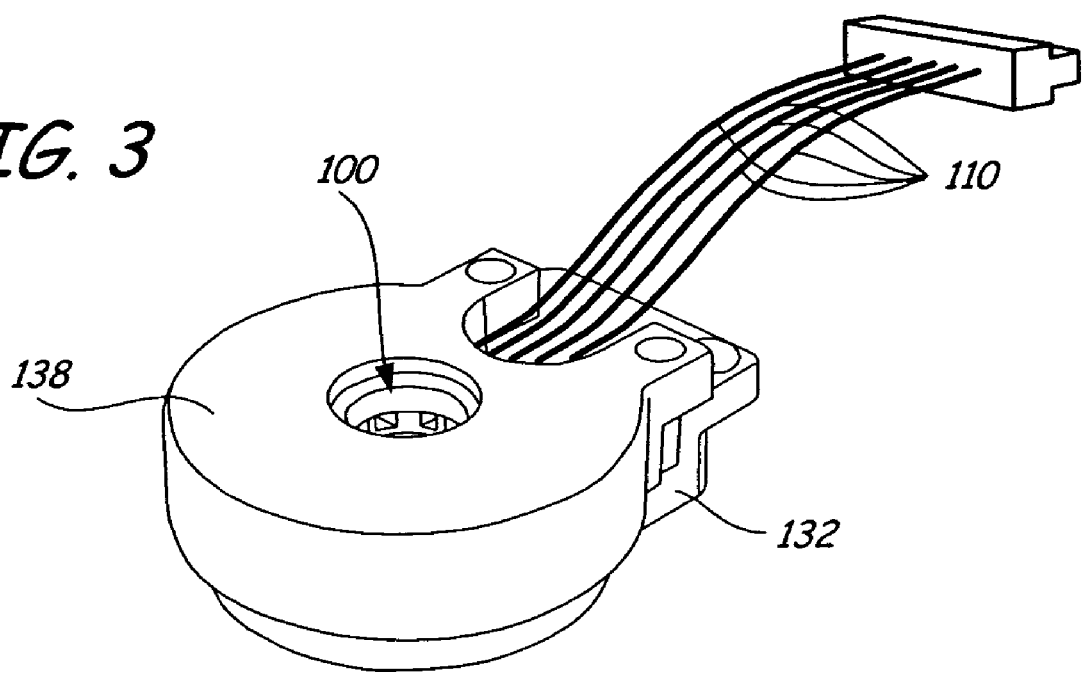
FIG. 3 illustrates a perspective view of one embodiment of a probing apparatus having a probe tile enclosed therein, in accordance with the principles of the present invention.
Figure 4:
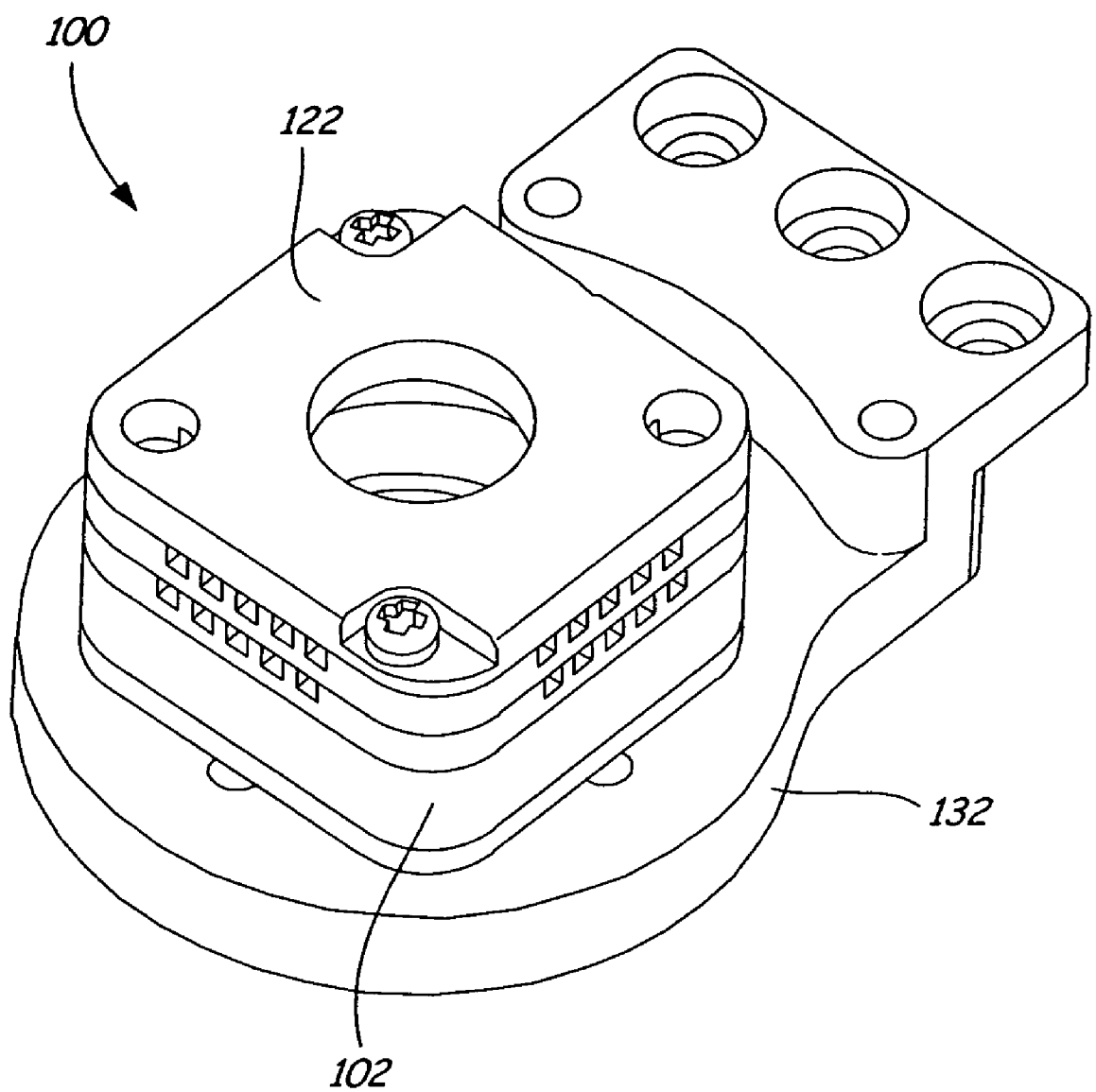
FIG. 4 illustrates a perspective view of one embodiment of a probe tile mounted on a distal end of a manipulator of a probing apparatus in accordance with the principles of the present invention.
Figure 5:
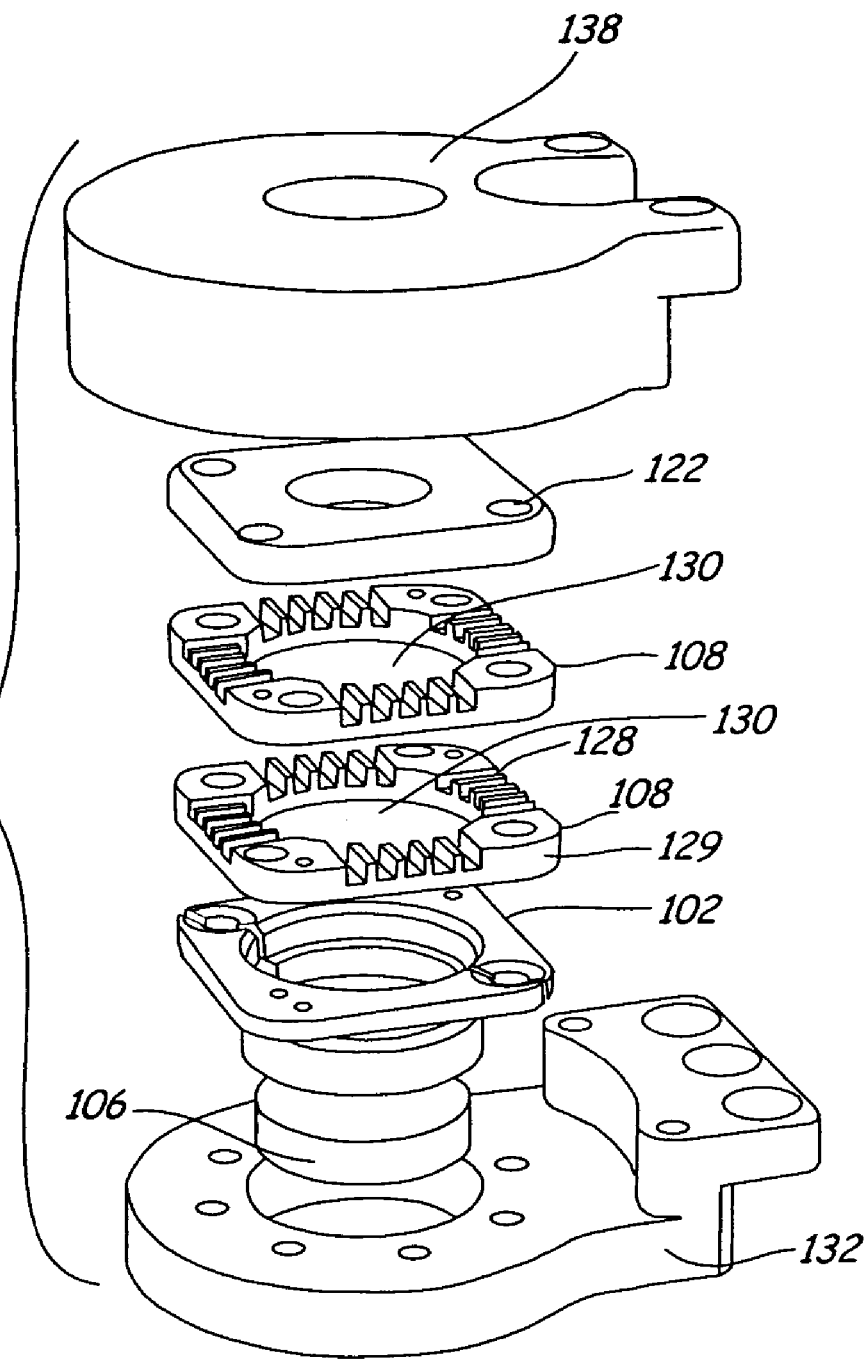
FIG. 5 illustrates an exploded view of the probe tile as shown in FIG. 4 except with a top cover thereon.
Figure 10:
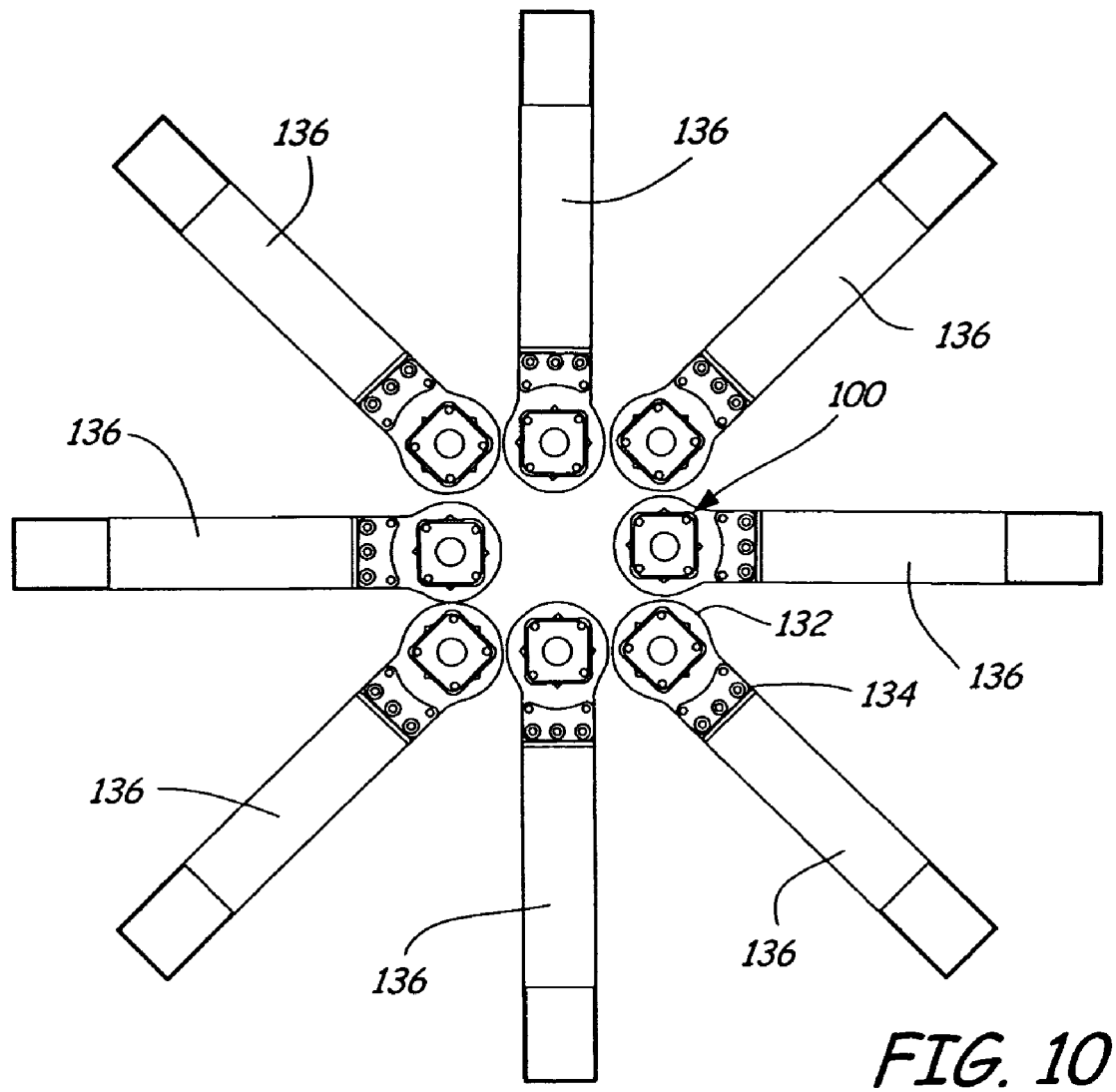
FIG. 10 illustrates a top view of one embodiment of a probing apparatus having a plurality of manipulators as shown in FIG. 9.

As shown in FIGS. 3-5 and 9-10, the probe tile 100 is mounted on a base plate 132 which is coupled to a distal end 134 of a manipulator arm 136 of a probing apparatus as shown in FIG. 10. Also, a protective top cover 138 is shown in FIG. 3 to protect and shield the probe tile 100.

It will be appreciated to a person skilled in the art that a plurality of wireguides 108 can be used in the assembly to provide additional access for the cables 110 as shown in FIGS. 1, 4-6, and 9. Also, a flexible O-ring strain relief 140 is disposed between the wireguides 108. Additional flexible O-ring strain relief 140 can be used between the top cover 122 and the wireguide 108.

Figure 7:
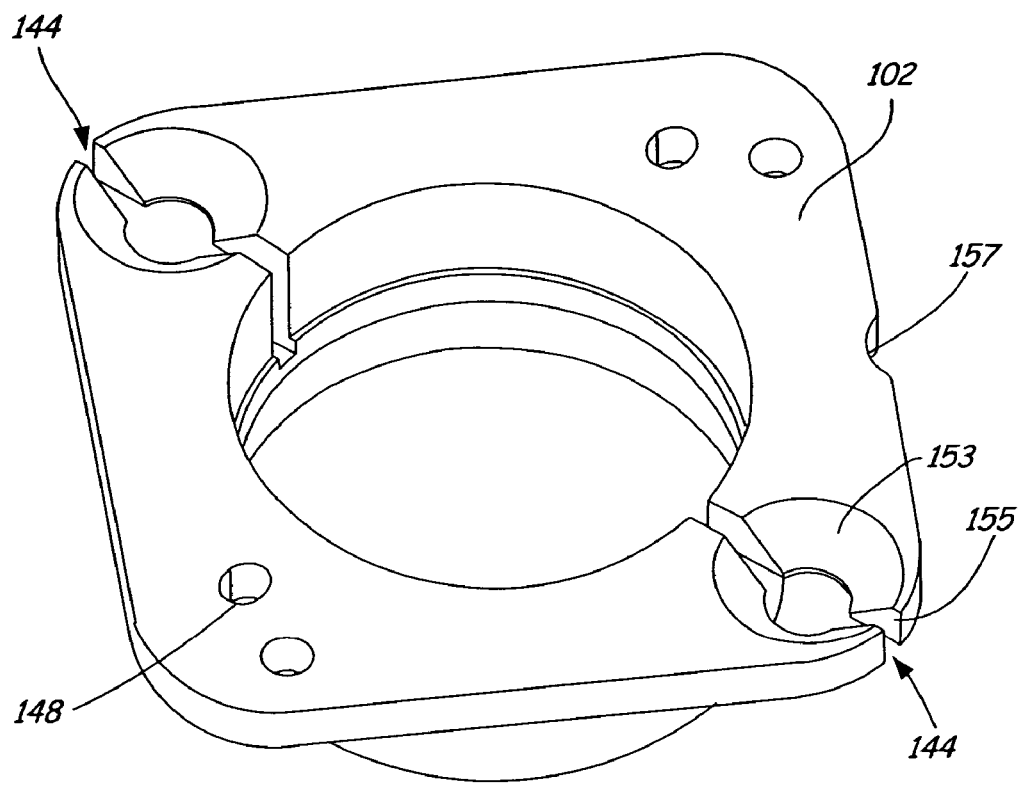
FIG. 7 illustrates a perspective view of one embodiment of a chassis body of the probe tile as shown in FIG. 6.

In FIG. 7, the chassis body 102 includes a split ring collet mechanism 144 and at least one slotted locating hole 148. When captive flat head screws 151 (see FIG. 6) are tightened, a countersink 153 forces a split ring 155 apart precisely locating the chassis body 102 in a base plate. The slotted locating holes 148 lock the rotational position of the chassis body 102. An orientation notch 157 may also be provided for visual orientation. Accordingly, the chassis body 102 can be mounted on an indexable base plate so as to provide a precise location for the probe tiles 100 to test the devices on the wafer. As shown in FIG. 8, a plurality of indexable location pins 146 that correspond with locating holes 148 are disposed on the base plate 112. Also as shown, the base plate 112 includes a plurality of probing locations or slots 114 for receiving removable probe tiles 100.

As shown in FIGS. 11a-11c, the guide mechanism 116 includes a modular adapter 150 which can be used to receive a variety of base plates 112, 120, and 156. The guide mechanism 116 includes a plurality of knobs 152 and/or any other suitable means of adjusting planetary and/or tilting angles of the base plate so that the base plate aligns with a wafer on the wafer station for precise probing and testing. The guide mechanism 116 may also include an interface member 154 configured and arranged to fit the base plate 156 in the modular adapter 150 for different probe stations.

Figure 12:
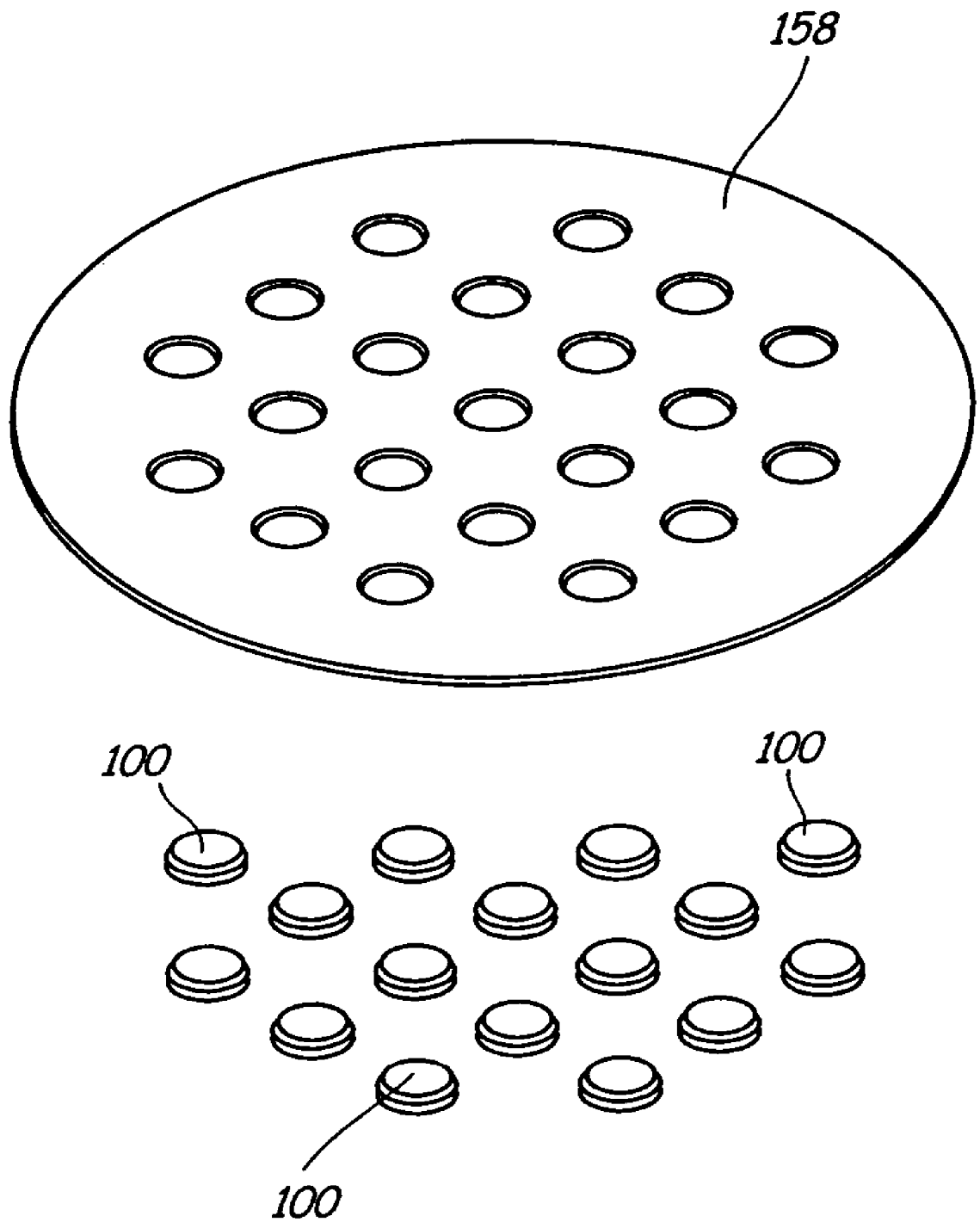
FIG. 12 illustrates a perspective, partially exploded view of one embodiment of a base plate having a plurality of removable probe tiles in accordance with the principles of the present invention.
Figure 13:
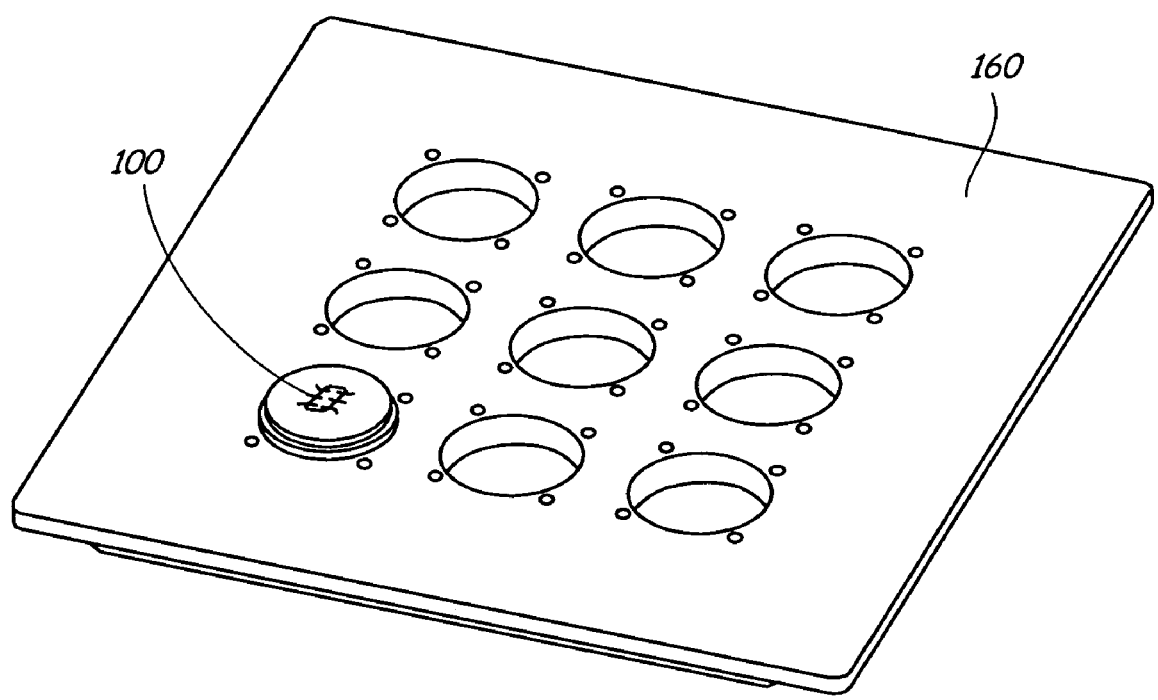
FIG. 13 illustrates a perspective view of another embodiment of a base plate having a removable probe tile in accordance with the principles of the present invention.

In FIG. 12, replaceable probe tiles 100 are mounted on a base plate 158 for testing semiconductor devices on a wafer. The base plate 158 can be replaced by another base plate, for adapting to a wafer with different die pitches, for example, a base plate 160 as shown in FIG. 13. The probe tiles 100 are removable from the base plate 158 for re-use in the base plate 160.

Figure 14:
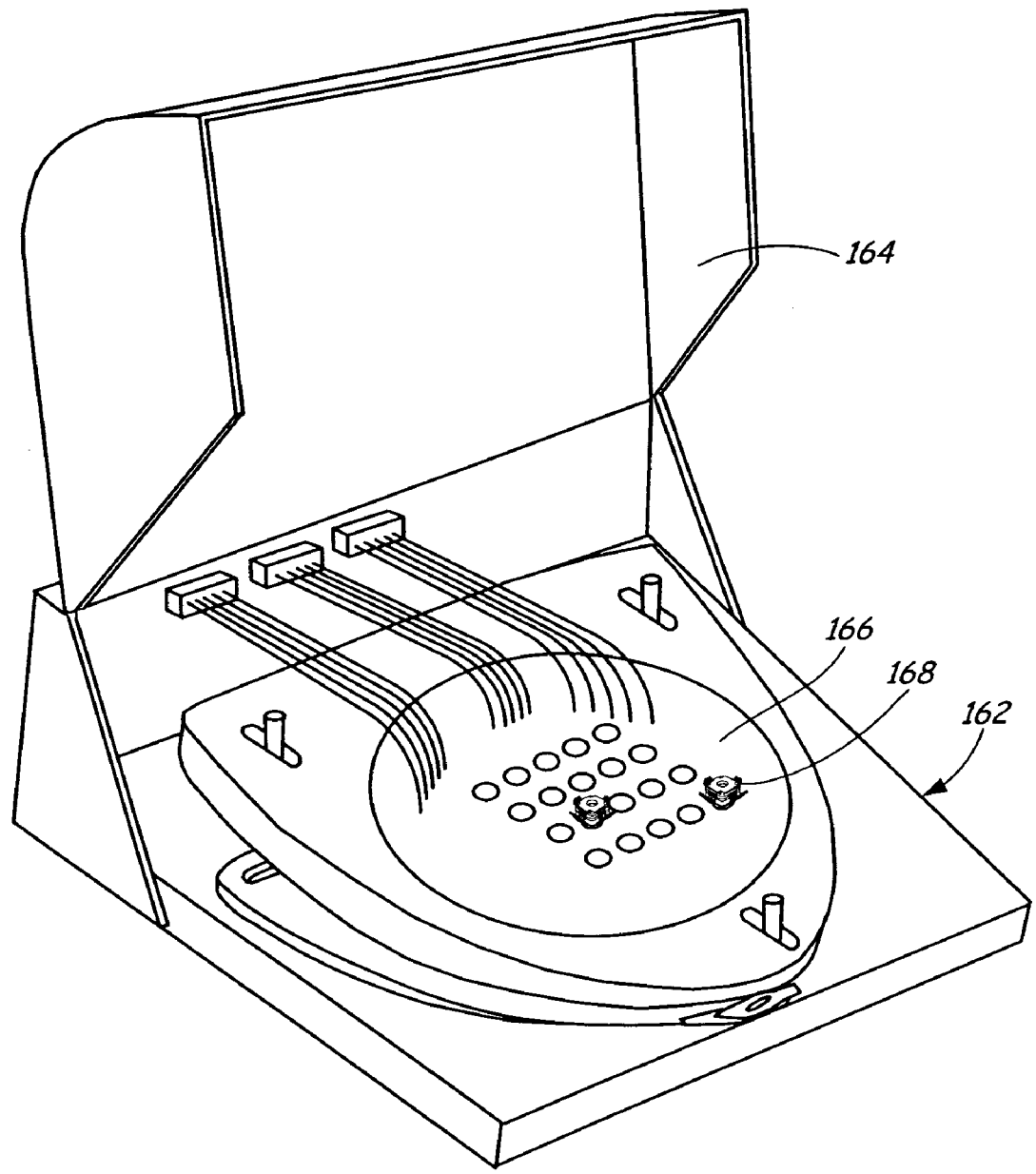
FIG. 14 illustrates a perspective view of one embodiment of a wafer station housing a replaceable base plate and a plurality of removable probe tiles in accordance with the principles of the present invention.

In FIG. 14, the replaceable probe tiles are mounted on a stand-alone wafer station 162. The wafer station 162 includes an enclosure 164 for housing a replaceable base plate 166 and a plurality of probe tiles 168 removably mounted on the base plate 166.

The numerous innovative teachings of the present application will be described with particular reference to the presently preferred embodiments, wherein these innovative teachings are advantageously applied to the particular problems of a probe apparatus for measuring low currents with a wide operating temperature range in probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

The following terms are particularly described throughout the description:

Semiconductor Device Not Limitive

The present invention is particularly suitable for probing semiconductor devices, but the use of the present teachings is not limited to probing semiconductor devices. Other devices, such as biological devices, may be applied to the present invention teachings. Thus, while this specification speaks in terms of probing 'semiconductor' devices, this term should be interpreted broadly to include probing any suitable device.

Low Current Not Limitive

The present invention solves the problem of measuring currents below 100 fA, but the current range of the present teachings is not limited to below 100 fA. For example, the present invention may be applied to measure the currents at or above 100 fA in a semiconductor device. Thus, while this specification speaks in terms of 'low currents' or 'measuring currents below 100 fA', these terms should be interpreted broadly to include any current that flows through a semiconductor device which could be at or above 100 fA.

Wide Temperature Not Limitive

The present invention solves the problem of measuring currents of a semiconductor device in a narrow or limited operating temperature range. The present teachings do not limit to a specific operating temperature range. The present application allows a tester to electrically probe semiconductor devices over a wide operating temperature range, not only at a low operating temperature but also a high operating temperature, e.g. an operating temperature up to 300 C. and beyond. Thus, while this specification speaks in terms of 'wide temperature range' or 'measuring currents in a wide operating temperature range', these terms should be interpreted broadly to include any suitable operating or testing temperature range of a semiconductor device.

Size Not Limitive

The present invention solves the problem of measuring currents and voltages of a semiconductor device using a compact probing apparatus. However, nothing in the teachings of the present invention limits application of the teachings of the present invention to a larger or smaller probe apparatus. Advantageous use of the teachings of the present invention may be had with a probe apparatus of any size.

Materials Not Limitive

Throughout the discussion herein there will be examples provided that make reference to materials, such as ceramic, in regards to dielectric block. The present invention does not recognize any limitations in regards to what types of materials may be used in affecting the teachings of the present invention. One skilled in the art will recognize that any suitable material may be used with no loss of generality in implementing the teachings of the present invention.

From the above description and drawings, it will be understood by those of ordinary skill in the art that the particular embodiments shown and described are for purposes of illustration only and are not intended to limit the scope of the present invention. Those of ordinary skill in the art will recognize that the present invention may be embodied in other specific forms without departing from its spirit or essential characteristics. References to details of particular embodiments are not intended to limit the scope of the invention.

What is claimed is:

1. A probe apparatus for probing a device on a semiconductor wafer to be tested by a testing equipment, comprising:
    a base plate having a plurality of probing slots;
    a probe tile being configured into a self-contained assembly, mounted and removable from one of the probing slots on the base plate to another probing slot on the base plate; and
    a guide mechanism, wherein the guide mechanism comprises:
       an adapter to receive the base plate; and
       a plurality of knobs for adjusting a tilting angle of the base plate so that the base plate aligns with the wafer.

2. The probe apparatus of claim 1, wherein the guide mechanism further comprises an interface member configured and arranged to fit the base plate in the adapter.

3. The probe apparatus of claim 2, wherein the base plate comprises: a mechanism for providing a precise location for the probe tile to test the device on the wafer.

* * * * *